US012174538B2

(12) United States Patent
Nishiguchi et al.

(10) Patent No.: US 12,174,538 B2
(45) Date of Patent: Dec. 24, 2024

(54) PHOTOSENSITIVE RESIN COMPOSITION, METHOD FOR PRODUCING RESIST PATTERN FILM, METHOD FOR PRODUCING PLATED FORMED PRODUCT, AND METHOD FOR PRODUCING TIN-SILVER PLATED-FORMED PRODUCT

(71) Applicant: JSR CORPORATION, Tokyo (JP)

(72) Inventors: Naoki Nishiguchi, Tokyo (JP); Tomoyuki Matsumoto, Tokyo (JP); Ayako Endo, Tokyo (JP)

(73) Assignee: JSR CORPORATION, Tokyo (JP)

( * ) Notice: Subject to any disclaimer, the term of this patent is extended or adjusted under 35 U.S.C. 154(b) by 759 days.

(21) Appl. No.: 17/435,408

(22) PCT Filed: Mar. 19, 2020

(86) PCT No.: PCT/JP2020/012235
§ 371 (c)(1),
(2) Date: Mar. 4, 2022

(87) PCT Pub. No.: WO2020/196235
PCT Pub. Date: Oct. 1, 2020

(65) Prior Publication Data
US 2023/0036031 A1    Feb. 2, 2023

(30) Foreign Application Priority Data

Mar. 27, 2019  (JP) ................................ 2019-060283

(51) Int. Cl.
| G03F 7/004 | (2006.01) |
| G03F 7/039 | (2006.01) |
| G03F 7/20 | (2006.01) |
| G03F 7/32 | (2006.01) |
| G03F 7/40 | (2006.01) |

(52) U.S. Cl.
CPC .......... *G03F 7/0048* (2013.01); *G03F 7/0045* (2013.01); *G03F 7/0392* (2013.01); *G03F 7/0397* (2013.01); *G03F 7/20* (2013.01); *G03F 7/322* (2013.01); *G03F 7/40* (2013.01)

(58) Field of Classification Search
CPC .... G03F 7/0048; G03F 7/0392; G03F 7/0397; G03F 7/04; H01L 21/32051
See application file for complete search history.

(56) References Cited

U.S. PATENT DOCUMENTS

| 2007/0196765 A1* | 8/2007 | Mori ...................... G03F 7/0392 430/270.1 |
| 2010/0316954 A1 | 12/2010 | Koyama et al. | |
| 2013/0171572 A1* | 7/2013 | Washio ................. G03F 7/0048 430/325 |

FOREIGN PATENT DOCUMENTS

| JP | 2000194127 A | 7/2000 |
| JP | 2000199960 A | 7/2000 |
| JP | 2000214587 A | 8/2000 |
| JP | 2000267283 A | 9/2000 |
| JP | 2002268223 A | 9/2002 |
| JP | 2002341539 A | 11/2002 |
| JP | 2003002925 A | 1/2003 |
| JP | 2004083900 A | 3/2004 |
| JP | 2004145048 A | 5/2004 |
| JP | 2004317907 A | 11/2004 |
| JP | 2004348106 A | 12/2004 |
| JP | 2005133066 A | 5/2005 |
| JP | 2005208366 A | 8/2005 |
| JP | 2006330368 A | 12/2006 |
| JP | 2014029518 A | 2/2014 |
| JP | 2014157252 A | 8/2014 |
| JP | 2015526752 A | 9/2015 |
| JP | 2015214634 A | 12/2015 |
| JP | 2016018075 A | 2/2016 |
| JP | 2016061933 A | 4/2016 |
| JP | 2016098350 A | 5/2016 |
| JP | 2016099483 A | 5/2016 |
| JP | 2016210761 A | 12/2016 |
| JP | 2017037320 A | 2/2017 |
| JP | 2017044875 A | 3/2017 |
| JP | 2017058421 A | 3/2017 |
| JP | 2017102260 A | 6/2017 |
| KR | 20180132900 A | 12/2018 |
| TW | 201743132 A | 12/2017 |
| WO | 2017182441 A1 | 10/2017 |

OTHER PUBLICATIONS

Office Action issued Mar. 18, 2024, in corresponding Taiwanese Patent Application No. 109109847.
Combined Office Action and Search Report issued May 18, 2023 in Taiwanese Patent Application No. 109109847 (with English translation), 18 pages.
Office Action issued Jul. 18, 2023 in Japanese Patent Application No. 2021-509303 (with English translation), 5 pages.
International Search Report issued May 26, 2020 in PCT/JP2020/012235 (with English translation), 5 pages.
Written Opinion issued May 26, 2020 in PCT/JP2020/012235 (with English translation), 8 pages.
Office Action issued Mar. 7, 2023 in Japanese Patent Application No. 2021-509303 (with English translation), 4 pages.
Office Action issued Mar. 18, 2024, in corresponding Taiwanese Patent Application No. 109109847 (with English translation), 17 pages.
Office Action issued May 20, 2024 in corresponding Korean Patent Application No. 10-2021-7029148 (with English translation), 14 pages.

\* cited by examiner

*Primary Examiner* — John S. Chu
(74) *Attorney, Agent, or Firm* — Element IP, PLC

(57) ABSTRACT

A photosensitive resin composition contains polymer (A) having an acid dissociative group, photoacid generator (B), and solvent (C), the solvent (C) containing 80 to 95% by mass of propylene glycol monomethyl ether acetate (C1) and 5 to 18% by mass of 3-methoxybutyl acetate (C2), a content ratio of other solvent (C3) in the solvent (C) being 0 to 10% by mass, and a content ratio of the solvent (C) contained in the photosensitive resin composition being less than 60% by mass.

9 Claims, 1 Drawing Sheet

[Fig. 1]
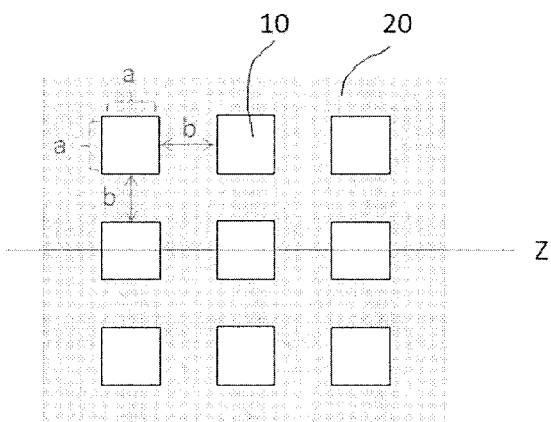
[Fig. 2]
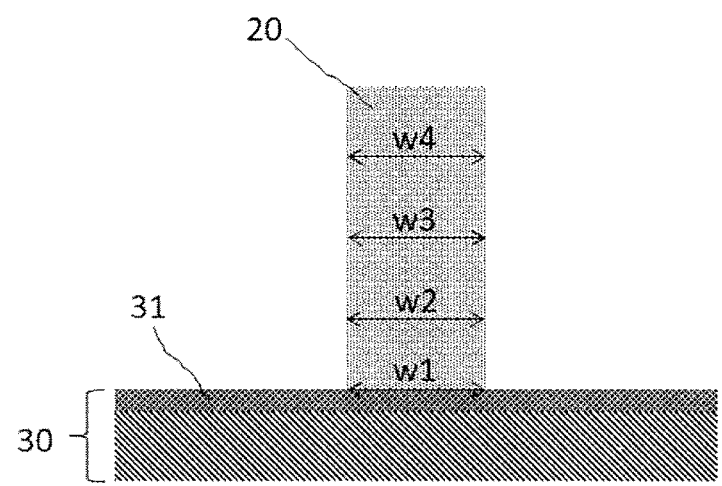

PHOTOSENSITIVE RESIN COMPOSITION, METHOD FOR PRODUCING RESIST PATTERN FILM, METHOD FOR PRODUCING PLATED FORMED PRODUCT, AND METHOD FOR PRODUCING TIN-SILVER PLATED-FORMED PRODUCT

TECHNICAL FIELD

The present invention relates to a photosensitive resin composition, a method for producing a resist pattern film, a method for producing a plated formed product, and a method for producing a tin-silver plated-formed product.

BACKGROUND ART

To improve the performance of mobile devices such as smartphones and tablet terminals, semiconductor chips with different functions are packaged by using high-density packaging technology such as FO-WLP (Fan-Out Wafer Level Package), FO-PLP (Fan-Out Panel Level Package), TSV (Through Silicon Via), and silicon interposers.

In such packaging technology, the wiring and bump electrodes (bumps) used for electrical connections between semiconductor chips also become denser. Therefore, the resist pattern film used for forming wiring and bumps is also required to be fine and dense.

Wiring and bumps are typically plated formed products, and are produced by applying a photosensitive resin composition onto the metal film of a substrate having a metal film such as a copper to form a resist coating, exposing and developing the resist coating with a mask to form a thick resist pattern film, and plating the surface of the substrate with the thick resist pattern film as a mold (refer to Patent Literatures 1 and 2).

CITATION LIST

Patent Literature

Patent Literature 1: JP 2010-008972 A
Patent Literature 2: JP 2006-330368 A

SUMMARY OF INVENTION

Technical Problem

When the wiring and the bump become fine and dense, the distance to the adjacent wiring or bump becomes short, and the contact area between the wiring and the bump and the metal film such as a copper film becomes small, requiring that a plated formed product having a rectangular cross section. Therefore, a resist pattern film to be a plating mold is also required to have a rectangular cross section.

In addition, there is a problem of a mold residue easily adhering to the plated formed product when the resist pattern used as a mold for plating is removed from the substrate on which the plated formed product produced by the above method is provided. This residue is particularly remarkable when the plated formed product is a tin-silver alloy compound.

The object of the present invention according to the first aspect is to provide: a photosensitive resin composition capable of forming a resist pattern film having a rectangular cross section; a method for producing a resist pattern film with the photosensitive resin composition; and a method for producing a plated formed product with the resist pattern film.

In addition, the object of the present invention according to the second aspect is to provide a method for producing a plated formed product by using a photosensitive resin composition capable of suppressing adhesion of a residue of the photosensitive resin composition serving as a mold to a plated formed product when the plated formed product is produced on a metal substrate, and capable of suppressing swelling of a resist pattern film during production of the plated formed product.

Solution to Problem

The present inventors have intensively investigated to solve the above problems. As a result, the present inventors have found that the above problems can be solved by a photosensitive resin composition having the following constitution, and have completed the present invention. That is, the present invention relates to, for example, the following [1] to [9].

[1] A photosensitive resin composition containing polymer (A) having an acid dissociative group, photoacid generator (B), and solvent (C), the solvent (C) containing 80 to 95% by mass of propylene glycol monomethyl ether acetate (C1) and 5 to 18% by mass of 3-methoxybutyl acetate (C2), a content ratio of other solvent (C3) in the solvent (C) being 0 to 10% by mass, and a content ratio of the solvent (C) contained in the photosensitive resin composition being less than 60% by mass.

[2] The photosensitive resin composition according to [1], wherein the solvent (C) contains 85 to 90% by mass of the propylene glycol monomethyl ether acetate (C1) and 10 to 15% by mass of the 3-methoxybutyl acetate (C2), and a content ratio of the other solvent (C3) in the solvent (C) is 0 to 5% by mass.

[3] The photosensitive resin composition according to [1] or [2], containing 30 to 60% by mass of the polymer (A) having an acid dissociative group, 0.1 to 6% by mass of the photoacid generator (B), and 40% by mass or more and less than 60% by mass of the solvent (C).

[4] A method for producing a resist pattern film, the method including: a step (1) of forming a resin film of the photosensitive resin composition according to any one of [1] to [3] on a metal film of a substrate having the metal film; a step (2) of exposing the resin film; and a step (3) of developing the exposed resin film.

[5] The method for producing a resist pattern film according to [4], wherein a resist pattern film produced by a method for producing a resist pattern film has a thickness of 30 to 100 μm.

[6] A method for producing a plated formed product, the method including a step of performing a plating treatment with a resist pattern film, as a mold, formed by the method for producing a resist pattern film according to [4] or [5].

[7] A method for producing a tin-silver plated-formed product, including a step (1) of forming a resin film of a photosensitive resin composition on a metal film of a substrate having the metal film; a step (2) of exposing the resin film; a step (3) of developing the exposed resin film to provide a resist pattern film; and a step (4') of tin-silver plating with the resist pattern film as a mold to form a plated formed product, the photosensitive resin composition being a photosensitive resin composition containing polymer (A) having an acid dissociative group, photoacid generator (B), and solvent (C), and the solvent (C) containing 70 to 95% by mass of propylene glycol monomethyl ether acetate (C1) and 5 to 30% by mass of 3-methoxybutyl acetate (C2).

[8] The method for producing a tin-silver plated-formed product according to [7], wherein a content ratio of the solvent (C) contained in the photosensitive resin composition is less than 60% by mass.

[9] The method for producing a tin-silver plated-formed product according to [7] or [8], wherein the solvent (C) contains 80 to 95% by mass of the propylene glycol monomethyl ether acetate (C1) and 5 to 18% by mass of the 3-methoxybutyl acetate (C2), and a content ratio of other solvent (C3) in the solvent (C) is 0 to 10% by mass.

Advantageous Effects of Invention

The photosensitive resin composition of the present invention according to the first aspect can form a resist pattern film having a rectangular cross section. The present invention according to the second aspect can provide a method for producing a plated formed product by using a photosensitive resin composition capable of suppressing adhesion of a residue of the photosensitive resin composition serving as a mold to a plated formed product when the plated formed product is produced on a metal substrate, and capable of suppressing swelling of a resist pattern film during production of the plated formed product.

BRIEF DESCRIPTION OF DRAWINGS

FIG. 1 is a view for explaining a shape of a resist pattern film produced in Examples as viewed from above.

FIG. 2 is a view explaining a cross-sectional shape of a resist pattern film produced in Examples.

DESCRIPTION OF EMBODIMENTS

Unless otherwise specified, each component exemplified in the present description, for example, each component in the photosensitive resin composition and each structural unit in polymer (A), may be included singly, or two or more thereof may be included.

Hereinafter, there will be described a photosensitive resin composition, a method for producing a resist pattern film by using the photosensitive resin composition, and a method for producing a plated formed product by using the resist pattern film, for the present invention according to the first aspect.

[Photosensitive Resin Composition]

The photosensitive resin composition of the present invention (hereinafter also referred to as "the present composition") is a photosensitive resin composition containing polymer (A) having an acid dissociative group (hereinafter also referred to as "polymer (A)"), photoacid generator (B), and solvent (C), wherein solvent (C) contains 80 to 95% by mass of propylene glycol monomethyl ether acetate (C1) and 5 to 18% by mass of 3-methoxybutyl acetate (C2), the content ratio of other solvent (C3) in solvent (C) is 0 to 10% by mass, and the content ratio of solvent (C) contained in the photosensitive resin composition is less than 60% by mass.

<Polymer (A)>

Polymer (A) has an acid dissociative group.

The acid dissociative group is a group that can be dissociated by the action of an acid generated from photoacid generator (B). As a result of the dissociation, acidic functional groups such as a carboxy group and a phenolic hydroxyl group are generated in polymer (A). As a result, the solubility of polymer (A) in an alkaline developer changes, and the composition can form a resist pattern film.

Polymer (A) has an acidic functional group protected by an acid dissociative group. Examples of the acidic functional group include a carboxy group and a phenolic hydroxyl group. Examples of polymer (A) include a (meth)acrylic resin in which a carboxy group is protected by an acid dissociative group, and a polyhydroxystyrene resin in which a phenolic hydroxyl group is protected by an acid dissociative group.

The polystyrene-equivalent weight average molecular weight (Mw) of polymer (A) measured by gel permeation chromatography is typically 1000 to 500000, preferably 3000 to 300000, more preferably 10000 to 100000, and still more preferably 20000 to 60000.

The ratio of Mw of polymer (A) to the polystyrene-equivalent number average molecular weight (Mn) measured by gel permeation chromatography, (Mw/Mn), is typically 1 to 5, and preferably 1 to 3.

The present composition can contain one or more polymers (A). The content ratio of polymer (A) in the present composition is typically 70 to 99.5% by mass, preferably 80 to 99% by mass, and more preferably 90 to 98% by mass in the solid content of 100% by mass of the composition. The above solid content refers to all components other than solvent (C) described later.

The content ratio of polymer (A) contained in the present composition is typically 30 to 60% by mass, and preferably 35 to 59% by mass. Within the above range, a thick resist pattern film having a rectangular cross section can be obtained.

<<Structural Unit (a1)>>

Polymer (A) typically has structural unit (a1) having an acid dissociative group.

Examples of structural unit (a1) include the structural unit represented by formula (a1-10) and the structural unit represented by formula (a1-20), and the structural unit represented by formula (a1-10) is preferable.

[Chemical Formula 1]

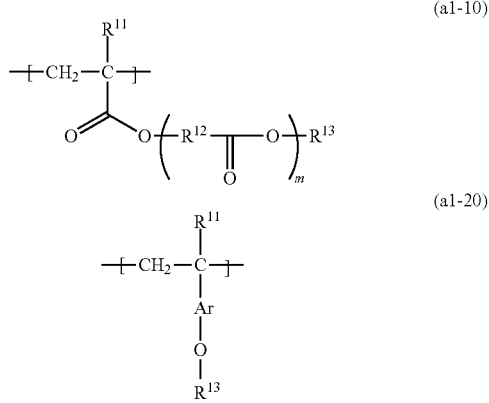

The meanings of the symbols in formulas (a1-10) and (a1-20) are as follows.

$R^{11}$ is a hydrogen atom, an alkyl group having 1 to 10 carbon atoms, or a group obtained by substituting at least one hydrogen atom in the alkyl group (hereinafter also referred to as "substituted alkyl group") with another group such as a halogen atom including a fluorine atom and a bromine atom, an aryl group including a phenyl group, a hydroxyl group, and an alkoxy group.

$R^{12}$ is a divalent organic group having 1 to 10 carbon atoms. Ar is an arylene group having 6 to 10 carbon atoms. $R^{13}$ is an acid dissociative group.

m is an integer of 0 to 10, preferably an integer of 0 to 5, and more preferably an integer of 0 to 3.

Examples of the alkyl group having 1 to 10 carbon atoms include a methyl group, an ethyl group, an n-propyl group, an isopropyl group, an n-butyl group, a pentyl group, and a decyl group.

Examples of the divalent organic group having 1 to 10 carbon atoms include: an alkanediyl group having 1 to 10 carbon atoms such as a methylene group, an ethylene group, a propane-1,3-diyl group, a propane-1,2-diyl group, and a decane-1,10-diyl group; and a group obtained by substituting at least one hydrogen atom in the alkanediyl group with another group such as a halogen atom including a fluorine atom and a bromine atom, an aryl group including a phenyl group, a hydroxyl group, and an alkoxy group.

Examples of the arylene group having 6 to 10 carbon atoms include a phenylene group, a methylphenylene group, and a naphthylene group.

Examples of the acid dissociative group include a group that dissociates due to the action of an acid and thereby generates an acidic functional group such as a carboxy group and a phenolic hydroxyl group in polymer (A). Specific examples thereof include an acid dissociative group represented by formula (g1) and a benzyl group, and the acid dissociative group represented by formula (g1) is preferable.

[Chemical Formula 2]

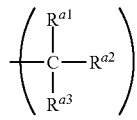

(g1)

In the formula (g1), $R^{a1}$ to $R^{a3}$ each independently represent an alkyl group, an alicyclic hydrocarbon group, or a group obtained by substituting at least one hydrogen atom in the alkyl group or the alicyclic hydrocarbon group with another group such as a halogen atom including a fluorine atom and a bromine atom, an aryl group including a phenyl group, a hydroxyl group, and an alkoxy group. $R^{a1}$ and $R^{a2}$ may be bonded to each other to form an alicyclic structure together with the carbon atom C to which $R^{a1}$ and $R^{a2}$ are bonded.

Examples of the alkyl group of $R^{a1}$ to $R^{a3}$ include an alkyl group having 1 to 10 carbon atoms such as a methyl group, an ethyl group, an n-propyl group, an isopropyl group, an n-butyl group, a pentyl group, and a decyl group.

Examples of the alicyclic hydrocarbon group of $R^{a1}$ to $R^{a3}$ include: a monocyclic saturated cyclic hydrocarbon groups such as a cyclobutyl group, a cyclopentyl group, a cyclohexyl group, a cycloheptyl group, and a cyclooctyl group; a monocyclic unsaturated cyclic hydrocarbon group such as a cyclobutenyl group, a cyclopentenyl group, and a cyclohexenyl group; and a polycyclic saturated cyclic hydrocarbon group such as a norbornyl group, an adamantyl group, a tricyclodecyl group, and a tetracyclododecyl group.

Examples of the alicyclic structure formed by $R^{a1}$, $R^{a2}$, and carbon atom C includes: a monocyclic saturated cyclic hydrocarbon structure such as cyclobutyl, cyclopentyl, cyclohexyl, cycloheptyl, and cyclooctyl; a monocyclic unsaturated cyclic hydrocarbon structure such as cyclobutenyl, cyclopentenyl, and cyclohexenyl; and a polycyclic saturated cyclic hydrocarbon structure such as norbornyl, adamantyl, tricyclodecyl, and tetracyclododecyl.

The groups represented by formulas (g11) to (g15) are preferable as the acid dissociative group represented by formula (g1).

[Chemical Formula 3]

(g11)

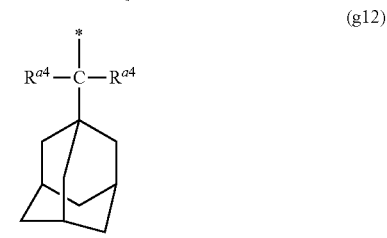

(g12)

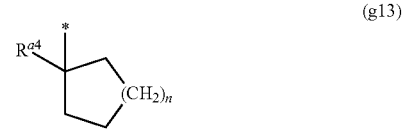

(g13)

(g14)

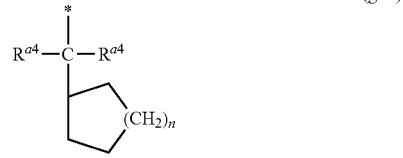

(g15)

In formulas (g11) to (g15), $R^{a4}$ each independently represents an alkyl group having 1 to 10 carbon atoms such as a methyl group, an ethyl group, an isopropyl group, and an n-butyl group, and n is an integer of 1 to 4. Each ring structure in formulas (g11) to (g14) may have one or more substituents such as an alkyl group having 1 to 10 carbon atoms, a halogen atom including a fluorine atom and a bromine atom, a hydroxyl group, and an alkoxy group. * indicates a bonding hand.

In addition to the structural units shown in formulas (a1-10) and (a1-20), examples of structural unit (a1) include: a structural unit having an acetal-based acid dissociative group described in JP 2005-208366 A, JP 2000-194127 A, JP 2000-267283 A, and JP 2004-348106 A; a structural unit having a sultone ring described in JP 2013-101321 A; and a structural unit having a crosslinked acid dissociative group described in JP 2000-214587 A and JP 2000-199960 A.

The structural units described in the above publication shall be described in the present description. Polymer (A) can have one or more structural units (a1). The content ratio of structural unit (a1) in polymer (A) is typically 10 to 65 mol %, preferably 15 to 55 mol %, and more preferably 20 to 50 mol %.

In the present description, the content ratio of each structural unit in polymer (A) is a value when the total of all the structural units constituting polymer (A) is 100 mol %. Each of the structural units represents a unit derived from a monomer during the synthesis of polymer (A). The content ratio of each structural unit can be measured by $^1$H-NMR.

In one embodiment, polymer (A) preferably has the structural unit shown in formula (a1-10) in which $R^{11}$ is a hydrogen atom, and the structural unit represented by formula (a1-10) in which $R^{11}$ is an alkyl group having 1 to 10 carbon atoms or a substituted alkyl group, as structural unit (a1). Such an embodiment tends to allow further improvement of the resolution of the present composition, and to allow further improvement of the swelling resistance and crack resistance to a plating solution for the resist pattern film.

<<Structural Unit (a2)>>

Polymer (A) can further have structural unit (a2) having a group that promotes solubility in an alkaline developer (hereinafter, also referred to as "solubility promoting group"). Polymer (A) having structural unit (a2) can adjust lithographic characteristics such as the resolution, sensitivity, and depth of focus of the resin film formed from the present composition.

Examples of structural unit (a2) includes a structural unit having at least one group or structure selected from a carboxy group, a phenolic hydroxyl group, an alcoholic hydroxyl group, a lactone structure, a cyclic carbonate structure, a sultone structure, and a fluoroalcohol structure (those corresponding to structural unit (a1) are excluded). Of these, a structural unit having a phenolic hydroxyl group is preferable because of being capable of forming a resist pattern film that is resistant to pressing from plating when forming a plated formed product.

Examples of the structural unit having a carboxy group include a structural unit derived from the monomer such as (meth)acrylic acid, crotonic acid, maleic acid, fumaric acid, cinnamic acid, 2-carboxyethyl (meth)acrylate, 2-carboxypropyl(meth)acrylate, and 3-carboxypropyl(meth)acrylate, and a structural unit described in JP 2002-341539 A.

Examples of the structural unit having a phenolic hydroxyl group include a structural unit derived from the monomer having a hydroxyaryl group such as 2-hydroxystyrene, 4-hydroxystyrene, 4-isopropenylphenol, 4-hydroxy-1-vinylnaphthalene, 4-hydroxy-2-vinylnaphthalene, and 4-hydroxyphenyl(meth)acrylate. Examples of the hydroxyaryl group include: a hydroxyphenyl group such as a hydroxyphenyl group, a methylhydroxyphenyl group, a dimethylhydroxyphenyl group, a dichlorohydroxyphenyl group, a trihydroxyphenyl group, and a tetrahydroxyphenyl group; and a hydroxynaphthyl group such as a hydroxynaphthyl group and a dihydroxynaphthyl group.

Examples of the structural unit having an alcoholic hydroxyl group include a structural unit derived from the monomer such as 2-hydroxyethyl(meth)acrylate and 3-(meth)acryloyloxy-4-hydroxytetrahydrofuran, and a structural unit described in JP 2009-276607 A.

Examples of the structural unit having a lactone structure include a structural unit described in JP 2017-058421 A, WO 2009/113228, JP 2010-138330 A, JP 2010-275555 A, JP 2016-098350 A, and JP 2015-214634 A.

Examples of the structural unit having a cyclic carbonate structure include a structural unit described in JP 2017-058421 A, JP 2009-223294 A, and JP 2017-044875 A.

Examples of the structural unit having a sultone structure include a structural unit described in JP 2017-058421 A, JP 2014-029518 A, JP 2016-061933 A, and JP 2013-007846 A.

Examples of the structural unit having a fluoroalcohol structure include a structural unit described in JP 2004-083900 A, JP 2003-002925 A, JP 2004-145048 A, and JP 2005-133066 A.

The structural units described in the above publication shall be described in the present description.

Polymer (A) can have one or more structural units (a2).

The content ratio of structural unit (a2) in polymer (A) is typically 10 to 80 mol %, preferably 20 to 65 mol %, and more preferably 25 to 60 mol %. As long as the content ratio of structural unit (a2) is within the above range, the dissolution rate in an alkaline developer can be increased, and as a result, the resolution of the present composition in a thick film can be improved.

Polymer (A) can have structural unit (a2) in the same polymer as or different polymer from the polymer having structural unit (a1); however, polymer (A) preferably has the structural units (a1) to (a2) in the same polymer.

<<Structural Unit (a3)>>

Polymer (A) can further have another structural unit (a3) other than structural units (a1) to (a2).

Examples of structural unit (a3) include:
- a structural unit derived from a vinyl compound such as styrene, 2-methylstyrene, 3-methylstyrene, 4-methylstyrene, 2-methoxystyrene, 3-methoxystyrene, 4-methoxystyrene;
- a structural unit derived from an aliphatic (meth)acrylic acid ester compound such as methyl (meth)acrylate, ethyl (meth)acrylate, n-butyl (meth)acrylate, n-pentyl (meth)acrylate, n-hexyl (meth)acrylate, 2-ethylhexyl (meth)acrylate, 2-methoxyethyl (meth)acrylate, 2-methoxybutyl (meth)acrylate, lauroyloxytetraethyleneglycol (meth)acrylate, lauroyloxydipropyleneglycol (meth)acrylate, and lauroyloxytripropyleneglycol (meth)acrylate;
- a structural unit derived from an alicyclic (meth)acrylic acid ester compound such as cyclopentyl (meth)acrylate, norbornyl(meth)acrylate, isobornyl (meth)acrylate, tricyclodecanyl(meth)acrylate, dicyclopentenyl (meth)acrylate, tetrahydrofuranyl(meth)acrylate, and tetrahydropyranyl(meth)acrylate;
- a structural unit derived from an aromatic ring-containing (meth)acrylic acid ester compound such as phenyl (meth)acrylate and phenethyl(meth)acrylate;
- a structural unit derived from an unsaturated nitrile compound such as (meth)acrylonitrile, croton nitrile, maleine nitrile, and fumaronitrile;
- a structural unit derived from an unsaturated amide compound such as (meth)acrylamide and N, N-dimethyl (meth)acrylamide; and
- a structural unit derived from an unsaturated imide compound such as maleimide, N-phenylmaleimide, and N-cyclohexylmaleimide.

Polymer (A) can have one or more structural units (a3).

The content ratio of structural unit (a3) in polymer (A) is typically 40 mol % or less.

Polymer (A) can have structural unit (a3) in the same polymer as or different polymer from the polymer having structural unit (a1) and/or structural unit (a2); however, polymer (A) preferably has the structural units (a1) to (a3) in the same polymer.

<<Method for Producing Polymer (A)>>

Polymer (A) can be produced by polymerizing the monomer corresponding to each structural unit in a suitable polymerization solvent by a known polymerization method such as an ionic polymerization method or a radical polymerization method. Of these, the radical polymerization method is preferable.

Examples of the radical polymerization initiator used in the radical polymerization method include: the azo compound such as 2,2'-azobisisobutyronitrile, 2,2'-azobis(methylisobutyrate), and 2,2'-azobis-(2,4-dimethylvaleronitrile); and an organic peroxide such as benzoylperoxide, laurylperoxide, and t-butylperoxide.

In the polymerization, a molecular weight modifier such as a mercaptan compound or a halogen hydrocarbon can be used, as necessary.

<Photoacid Generator (B)>

Photoacid generator (B) is a compound that generates an acid by exposure. The action of this acid dissociates the acid dissociative group in polymer (A) to generate an acidic functional group such as a carboxy group and a phenolic hydroxyl group. As a result, the exposed portion of the resin film formed from the present composition becomes easily soluble in an alkaline developer, and a positive resist pattern film can be formed. As described above, the present composition functions as a chemically amplified positive photosensitive resin composition.

Examples of photoacid generator (B) include compounds described in JP 2004-317907 A, JP 2014-157252 A, JP 2002-268223 A, JP 2017-102260 A, JP 2016-018075 A, and JP 2016-210761 A. These shall be described herein.

Specific examples of photoacid generator (B) include: an onium salt compound such as diphenyliodonium trifluoromethanesulfonate, diphenyliodonium p-toluenesulfonate, diphenyliodonium hexafluoroantimonate, diphenyliodonium hexafluorophosphate, diphenyliodonium tetrafluoroborate, triphenylsulfonium trifluoromethanesulfonate, triphenylsulfonium hexafluoroantimonate, triphenylsulfonium hexafluorophosphate, 4-t-butylphenyl diphenylsulfonium trifluoromethanesulfonate, 4-t-butylphenyl diphenylsulfonium benzenesulfonate, 4,7-di-n-butoxynaphthyltetrahydrothiophenium trifluoromethanesulfonate, 4,7-di-n-butoxynaphthyltetrahydrothiophenium bis(trifluoromethanesulfonyl)imide anion, 4,7-di-n-butoxynaphthyltetrahydrothiophenium bis(nonafluorobutylsulfonyl)imide anion, and 4,7-di-n-butoxynaphthyltetrahydrothiophenium tris(nonafluorobutylsulfonyl) methide; a halogen-containing compound such as 1,10-dibromo-n-decane, 1,1-bis(4-chlorophenyl)-2, 2,2-trichloroethane, phenyl-bis(trichloromethyl)-s-triazine, 4-methoxyphenyl-bis(trichloromethyl)-s-triazine, styryl-bis(trichloromethyl)-s-triazine, and naphthyl-bis(trichloromethyl)-s-triazine; a sulfone compound such as 4-trisphenacyl sulfone, mesitylphenacyl sulfone, and bis(phenylsulfonyl) methane; a sulfonic acid compound such as benzointosilate, pyrogalloltristrifluoromethanesulfonate, o-nitrobenzyltrifluoromethanesulfonate, and o-nitrobenzyl-p-toluenesulfonate; a sulfone imide compound such as N-(trifluoromethylsulfonyloxy) succinimide, N-(trifluoromethylsulfonyloxy) phthalimide, N-(trifluoromethylsulfonyloxy)diphenylmaleimide, N-(trifluoromethylsulfonyloxy)-4-butyl-naphthylimide, N-(trifluoromethylsulfonyloxy)-4-propylthio-naphthylimide, N-(4-methylphenylsulfonyloxy) succinimide, N-(4-methylphenylsulfonyloxy) phthalimide, N-(4-methylphenylsulfonyloxy)diphenylmaleimide, N-(4-methylphenylsulfonyloxy) bicyclo[2.2.1]hept-5-ene-2,3-dicarboxyimide, N-(4-fluorophenylsulfonyloxy) bicyclo[2.1.1]heptane-5,6-oxy-2,3-dicarboxyimide, and N-(4-fluorophenylsulfonyloxy) naphthylimide, N-(10-campasulfonyloxy) naphthylimide; and a diazomethane compound such as bis(trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl-p-toluenesulfonyldiazomethane, cyclohexylsulfonyl-1,1-dimethylethylsulfonyldiazomethane, and bis(1,1-dimethylethylsulfonyl)diazomethane.

Of these, the onium salt compound and/or sulfonimide compound are preferable because of being capable of forming the resist pattern film that is excellent in resolution and resistance to a plating solution.

The present composition can contain one or more photoacid generators (B).

The content of photoacid generator (B) in the present composition is typically 0.1 to 20 parts by mass, preferably 0.3 to 15 parts by mass, and more preferably 0.5 to 10 parts by mass with respect to 100 parts by mass of polymer (A). When the content of photoacid generator (B) is within the above range, the resist pattern film having better resolution tends to be obtained.

The content ratio of photoacid generator (B) contained in the present composition is typically 0.1 to 6% by mass, and preferably 0.5 to 4% by mass. Within the above range, a thick resist pattern film having a rectangular cross section can be obtained.

<Solvent (C)>

The content ratio of propylene glycol monomethyl ether acetate (C1) contained in solvent (C) is typically 80% by mass or more, preferably 85% by mass or more, and the content ratio of 3-methoxybutyl acetate (C2) is typically 5% by mass or more, preferably 10% by mass or more, and the content ratio of other solvent (C3) is typically 0% by mass or more. The content ratio of propylene glycol monomethyl ether acetate (C1) contained in solvent (C) is typically 95% by mass or less, the content ratio of 3-methoxybutyl acetate (C2) is typically 18% by mass or less, and the content ratio of other solvent (C3) is typically 10% by mass or less, preferably 5% by mass or less.

When the content ratios of solvent (C1), solvent (C2), and solvent (C3) contained in solvent (C) are within the above ranges, a resist pattern film having a rectangular cross section can be formed.

Examples of solvent (C3) include: an alcoholic solvent such as ethylene glycol monomethyl ether, ethylene glycol monoethyl ether, diethylene glycol, diethylene glycol monoethyl ether, ethyl lactate, and propylene glycol monomethyl ether; an ester solvent such as ethyl acetate, ethyl 2-hydroxypropionate, ethyl 2-hydroxy-2-methylpropionate, methyl acetoacetate, ethyl ethoxyacetate, and γ-butyrolactone; a ketone solvent such as methylamylketone and cyclohexanone; an alkylene glycol dialkyl ether such as diethylene glycol dimethyl ether, diethylene glycol diethyl ether, diethylene glycol di-n-propyl ether, and dipropylene glycol dimethyl ether; and an alkylene glycol monoalkyl ether acetate such as ethylene glycol monomethyl ether acetate, ethylene glycol monoethyl ether acetate, propylene glycol monoethyl ether acetate, propylene glycol mono-n-propyl ether acetate, and dipropylene glycol methyl ether acetate.

Solvent (C3) may be used singly or in combination of two or more.

The content ratio of solvent (C) contained in the present composition is less than 60% by mass. The content ratio of solvent (C) contained in the present composition is typically 40% by mass or more and less than 60% by mass, preferably 40 to 55% by mass. Within the above range, a thick resist pattern film having a rectangular cross section can be obtained.

<Quencher (D)>

The present composition can further contain quencher (D).

Quencher (D) is, for example, a component used to control the diffusion of the acid generated by exposure from photoacid generator (B) in the resin film, and can thus improve the resolution of the present composition.

Examples of quencher (D) include a basic compound and the compound that generates a base, and examples thereof include compounds described in JP 2011-029636 A, JP 2014-013381 A, JP 2015-526752 A, JP 2016-099483, and JP 2017-037320. These shall be described herein.

Examples of quencher (D) include: an alkylamine such as n-hexylamine, n-heptylamine, di-n-butylamine, and triethylamine; an aromatic amine such as aniline and 1-naphthylamine; an alkanolamine such as triethanolamine; a polyamino compound such as ethylenediamine, 1,3-bis[1-(4-aminophenyl)-1-methylethyl]benzene, and polyethyleneimine; an amide compound such as formamide; an urea compound such as urea and methylurea; a nitrogen-containing heterocyclic compound such as imidazole and benzimidazole; and a nitrogen-containing compound with an acid dissociative group such as N-(t-butoxycarbonyl) piperidine, N-(t-butoxycarbonyl)-4-hydroxypiperidine, N-(t-butoxycarbonyl) imidazole, N-(t-butoxycarbonyl)benzimidazole, N-(t-butoxycarbonyl)-2-phenylbenzimidazole, and N-(t-amyloxycarbonyl)-2-phenylbenzimidazole.

The present composition may contain one or more quenchers (D). The content of quencher (D) in the present composition is typically 0.001 to 10 parts by mass, and preferably 0.001 to 5 parts by mass, with respect to 100 parts by mass of polymer (A).

<Other Components>

The present composition can further contain other components. Examples of the other components include: a surfactant that has the effect of improving the coatability and antifoaming properties of the photosensitive resin composition; a sensitizer that absorbs exposure light and improves the acid generation efficiency of the photoacid generator; an alkali-soluble resin or low-molecular-weight phenol compound that controls the dissolution rate of the resin film formed from the photosensitive resin composition in an alkaline developer; an ultraviolet absorber that blocks the light reaction caused by the scattered light wrapping around the unexposed area during exposure; a thermal polymerization inhibitor that enhances the storage stability of the photosensitive resin composition; an adhesion aid such as a mercapto compound, an imidazole compound, and a silane coupling agent that improves adhesion between a resist pattern film and a metal film of a substrate; an antioxidant; and an inorganic filler.

<Production of Photosensitive Resin Composition>

The present composition can be produced by uniformly mixing each of the above components. In addition, in order to remove foreign substances, the above-described components are uniformly mixed, and then the obtained mixture can be filtered with a filter such as a membrane filter or a capsule cartridge filter.

[Method for Producing Resist Pattern Film]

The method for producing a resist pattern film includes: a step (1) of forming a resin film of the photosensitive resin composition on the metal film of a substrate having metal film; a step (2) of exposing the resin film; and a step (3) of developing the exposed resin film.

<Step (1)>

Examples of the substrate include a semiconductor substrate and a glass substrate. The shape of the substrate is not particularly limited, and the surface shape includes a flat plate shape and an uneven shape, and the shape of the substrate includes a circular shape and a square shape. In addition, there is no limit to the size of the substrate.

Examples of the metal film include a film containing a metal such as aluminum, copper, silver, gold and palladium, and a film containing two or more alloys containing the metal, and a copper film, that is, the film including copper and/or copper alloy is preferable. The thickness of the metal film is typically 100 to 10000 Å, and preferably 500 to 2000 Å. The metal film is typically provided on the surface of the substrate. The metal film can be formed by a method such as a sputtering method.

The resin film is formed by applying the present composition onto the metal film of a substrate having a metal film.

Examples of the coating method of the present composition include a spin coating method, a roll coating method, a screen printing method, and an applicator method, and of these, the spin coating method and the screen printing method are preferable.

The present composition is applied, and then the present composition applied can be heat-treated for the purpose of, for example, volatilizing solvent. The conditions for the heat treatment are typically 0.5 to 20 minutes at 50 to 200° C. The thickness of the resin film is typically 1 to 200 μm, and preferably 30 to 100 μm.

<Step (2)>

In step (2), the resin film formed in step (1) is exposed. The exposure is typically performed selectively on the resin film by an unmagnified projection exposure or reduced projection exposure via a photomask having a predetermined mask pattern. Examples of the exposure light include ultraviolet rays or visible light having a wavelength of 150 to 600 nm, and preferably 200 to 500 nm. Examples of the light source of the exposure light include a low-pressure mercury lamp, a high-pressure mercury lamp, an ultra-high-pressure mercury lamp, a metal halide lamp, and a laser. The exposure amount can be appropriately selected depending on the type of exposure light, the type of the photosensitive resin composition, and the thickness of the resin film, and is typically 100 to 20000 mJ/cm$^2$.

After the exposure to the resin film, the resin film can be heat-treated before development. The conditions for the heat treatment are typically 0.5 to 10 minutes at 70 to 180° C. The above heat treatment can promote the dissociation reaction of the acid dissociative group by the acid in polymer (A).

<Step (3)>

In the step (3), the resin film exposed in the step (2) is developed to form a resist pattern film. Development is typically performed by using an alkaline developer. Examples of the developing method include a shower method, a spray method, a dipping method, a liquid filling method, and a paddle method. The developing conditions are typically 1 to 30 minutes at 10 to 30° C.

Examples of the alkaline developer include an aqueous solution containing one or more alkaline substances. Examples of the alkaline substance include sodium hydroxide, potassium hydroxide, sodium carbonate, sodium silicate, aqueous ammonia, ethylamine, n-propylamine, diethylamine, triethylamine, monoethanolamine, diethanolamine, triethanolamine, tetramethylammonium hydroxide, tetraethylammonium hydroxide, choline, pyrrole, and piperidine. The concentration of the alkaline substance in the alkaline developer is typically 0.1 to 10% by mass. The alkaline developer can further contain, for example, an organic solvent such as methanol, or ethanol and/or a surfactant.

The resist pattern film formed by development can be washed with water for example. Then, the above resist pattern film can be dried by using an air gun or a hot plate.

As described above, the resist pattern film that has a rectangular cross section and serves as a mold for forming a plated formed product can be formed on the metal film of the substrate, and thus a plating substrate having the resist pattern film (mold) on the metal film can be obtained. The thickness of the resist pattern film is typically 1 to 200 μm, and preferably 30 to 100 μm.

Typically, the resist pattern film having a thickness of 30 to 100 μm easily forms a resist pattern film having a non-rectangular cross section such as a footing-shaped cross section. Therefore, when the resist pattern film has a thickness of 30 to 100 μm, there is more apparent effect of the method for producing a resist pattern film of the present invention.

A shape suitable for the type of the plated formed product can be selected as the shape of the opening of the resist pattern film. When the plated formed product is a wiring, the shape is linear as viewed from the top of the opening of a resist pattern film, and when the plated formed product is a bump, the shape is square as viewed from the top of the opening of the resist pattern film.

The width of the resist pattern film is typically 1 to 300 μm, and preferably 15 to 100 μm. The ratio (T/W) between the width (W) of the resist pattern film and the thickness (T) of the resist pattern film is typically 0.5 or more, and preferably 1 to 10. Within the above range, there is more apparent effect of the method for producing a resist pattern film of the present invention.

[Method for Producing Plated Formed Product]

The method for producing a plated formed product of the present invention includes a step (4) of performing a plating treatment by using, as a mold, the resist pattern film formed by the method for producing a resist pattern film of the present invention.

<Step (4)>

Examples of the plating treatment include a wet plating treatment such as an electrolytic plating treatment, an electroless plating treatment, and a molten plating treatment, and a dry plating treatment such as chemical vapor deposition and sputtering.

A wiring or a connection terminal in processing at the wafer level is typically formed by the electrolytic plating treatment.

Before the plating treatment is performed, pretreatment such as ashing treatment, flux treatment, and desmear treatment can be performed in order to enhance affinity between the inner wall surface of the resist pattern film and the plating solution.

When the plating treatment is the electrolytic plating treatment, a layer formed on the inner wall of the resist pattern film by sputtering or electroless plating treatment can be used as the seed layer, and when a substrate having a metal film on the surface is used as the substrate, the metal film can also be used as the seed layer. A barrier layer may be formed before the seed layer is formed, and the seed layer can be used as the barrier layer.

Examples of the plating solution used in the electrolytic plating treatment include: a copper plating solution containing such as copper sulfate and copper pyrophosphate; a gold plating solution treatment containing gold potassium cyanide; and a nickel plating solution containing nickel sulfate or nickel carbonate.

The conditions for the electrolytic plating treatment can be appropriately selected depending on, for example, the type of the plating solution, and for example, in the case of the electrolytic plating treatment with copper sulfate, typically the temperature is 10 to 90° C. and the current density is 0.1 to 100 A/dm$^2$. Different plating treatments can be sequentially performed as the plating treatment. For example, a solder copper-pillar bump can be formed by first performing a copper plating treatment, then performing a nickel plating treatment, and then performing a melting solder plating treatment.

The thickness of the plated formed product varies depending on the application, and for example, when the plated formed product is a bump, the thickness is typically 5 to 200 μm, and when the plated formed product is a wiring, the thickness is typically 1 to 30 μm.

<Another Step>

In the method for producing a plated formed product of the present invention, another step includes a step of removing a resist pattern film (hereinafter, also referred to as "step (5)") after step (4). Step (5) is performed by, for example, a resist stripping solution containing tetramethylammonium hydroxide, dimethyl sulfoxide, and/or N, N-dimethylformamide.

Furthermore, the method for producing a plated formed product of the present invention can include a step of removing by a wet etching method the metal film in the region other than the region with the plated formed product formed.

Hereinafter, a method for producing a tin-silver plated-formed product according to the second aspect of the present invention will be described.

The present invention according to the second aspect is a method for producing a plated formed product by using a photosensitive resin composition capable of suppressing adhesion of a residue of the photosensitive resin composition as a mold to the plated formed product when the plated formed product is produced on a metal substrate.

That is, the present invention according to the second aspect is a method for producing a tin-silver plated-formed product, the method including: a step (1) of forming a resin film of a photosensitive resin composition on the metal film of a substrate having the metal film; a step (2) of exposing the resin film; a step (3) of developing the exposed resin film to provide a resist pattern film; and a step (4') of forming a plated formed product by tin-silver plating by using the resist pattern film as a mold.

[Photosensitive Resin Composition]

The photosensitive resin composition to be used in the second aspect contains polymer (A) having an acid dissociative group, photoacid generator (B), and solvent (C), wherein solvent (C) may contain 70 to 95% by mass of propylene glycol monomethyl ether acetate (C1), 5 to 30% by mass of 3-methoxybutyl acetate (C2), and, as necessary, 0 to 25% by mass of other solvent (C3).

Polymer (A) and photoacid generator (B) can include the same ones as those used in the first aspect. The photosensitive resin composition used in the second aspect can have the same composition as the photosensitive resin composition according to the first aspect except for the content ratio of each solvent in solvent (C).

<Solvent (C)>

The content ratio of propylene glycol monomethyl ether acetate (C1) contained in solvent (C) is typically 70% by mass or more, preferably 80% by mass or more, the content ratio of 3-methoxybutyl acetate (C2) is typically 5% by mass or more, and the content ratio of other solvent (C3) is typically 0% by mass or more. The content ratio of propylene glycol monomethyl ether acetate (C1) contained in solvent (C) is typically 95% by mass or less, the content ratio of 3-methoxybutyl acetate (C2) is typically 30% by mass or less, preferably 18% by mass or less, and the content ratio of other solvent (C3) is typically 25% by mass or less, preferably 10% by mass or less.

As long as the content ratios of solvent (C1), solvent (C2), and solvent (C3) contained in solvent (C) are within the above ranges, it is possible to suppress the adhesion of the residue derived from the photosensitive resin composition to the tin-silver plated-formed product in peeling off the resist pattern film, and it is possible to suppress swelling of the resist pattern film in producing the plated formed product.

Other solvent (C3) can contain those described in the first aspect. Solvent (C3) may be used singly or in combination of two or more.

The content ratio of solvent (C) contained in the photosensitive resin composition is preferably less than 60% by mass. The content ratio of solvent (C) contained in the photosensitive resin composition is typically 40% by mass or more and less than 60% by mass, preferably 40 to 55% by mass. Within the above range, a thick resist pattern film having a rectangular cross section can be obtained.

The photosensitive resin composition used in the second aspect can contain quencher (D) described in the photosensitive resin composition of the first aspect and other components.

[Method for Producing Plated Formed Product]

Steps (1) to (3) in the second aspect can be performed by the same method as steps (1) to (3) in [Method for producing resist pattern film] in the first aspect.

<Step (4')>

Step (4') is preferably a step of producing a tin-silver plated-formed product by electrolytic plating with the resist pattern film formed in step (3) as a mold.

A plated formed product can be produced in the same manner as in the above-described step (4) in the first aspect, except that the electrolytic plating solution to be used is a tin-silver plating solution.

Conditions for the electrolytic plating treatment are typically a temperature of 10 to 90° C. and a current density of 0.1 to 100 A/dm$^2$.

The thickness of the plated formed product varies depending on the application, and for example, when the plated formed product is a bump, the thickness is typically 5 to 200 μm, and when the plated formed product is a wiring, the thickness is typically 1 to 30 μm.

Step (5) described above may be performed after step (4').

EXAMPLE

Hereinafter, the present invention will be described in more detail based on examples, but the present invention is not limited to these examples.

<Weight Average Molecular Weight (Mw) of Polymer>

The weight average molecular weight (Mw) of the polymer was measured by the gel permeation chromatography method under the following conditions.

GPC apparatus: product name "HLC-8220-GPC" manufactured by Tosoh Corporation.
Column: TSK-M and TSK2500 columns manufactured by Tosoh Corporation were connected in series
Solvent: tetrahydrofuran
Temperature: 40° C.
Detection method: refractive index method
Standard substance: polystyrene <Production of Photosensitive Resin Composition (1)>

Example 1A

A photosensitive resin composition in Example 1A was produced by uniformly mixing 41 parts by mass of polymer (A1) having a monomer-derived structural unit represented by the following formula (A1) (Mw=45000), 0.5 parts by mass of photoacid generator (B1) represented by the following formula (B1), 0.002 parts by mass of quencher (D1) represented by the following formula (D1), and 0.001 parts by mass of surfactant (E1) (trade name: "NBX-15", manufactured by Neos corporation) in a mixed solvent having components shown in the following Table 1 so as to have a solid content of 58% by mass.

Example 2A to Example 5A and Comparative Example 1A to Comparative Example 6A

Photosensitive resin compositions in Example 2A to Example 5A and Comparative Example 1A to Comparative Example 6A were produced in the same manner as in Example 1A, except that the mixed solvent in Example 1A was changed to a mixed solvent having components shown in Table 1 below.

[Chemical Formula 4]

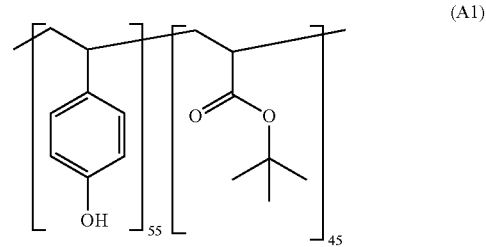

Each of the suffixes of the monomer-derived structural unit in formula (A1) represents a molar content ratio (mol %) of the monomer-derived structural unit included in the structural units derived from all monomers of polymer (A1).

[Chemical Formula 5]

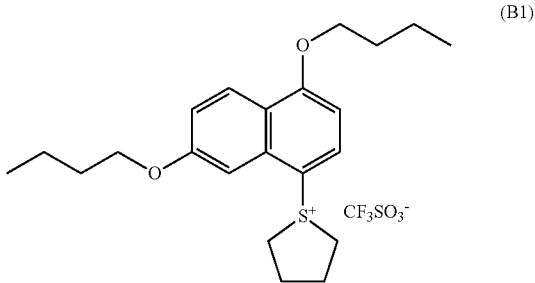

[Chemical Formula 6]

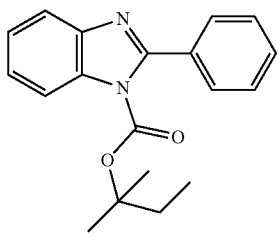

(D1)

TABLE 1

| | C1 | C2 | C3-1 | C3-2 | C3-3 |
|---|---|---|---|---|---|
| Example 1A | 85 | 10 | 5 | | |
| Example 2A | 82 | 18 | | | |
| Example 3A | 95 | 5 | | | |
| Example 4A | 85 | 15 | | | |
| Example 5A | 90 | 10 | | | |
| Comparative Example 1A | 100 | | | | |
| Comparative Example 2A | 60 | 40 | | | |
| Comparative Example 3A | 80 | | 20 | | |
| Comparative Example 4A | 85 | | | | 15 |
| Comparative Example 5A | 90 | 3 | 7 | | |
| Comparative Example 6A | 80 | 20 | | | |

The numerical values in Table 1 are based on parts by mass.

The details of the components of the mixed solvent in Table 1 are as follows.

C1: Propylene glycol monomethyl ether acetate
C2: 3-Methoxybutyl acetate
C3-1: γ-Butyrolactone
C3-2: Dipropylene glycol methyl ether acetate
C3-3: 2-Heptanone <Production of Resist Pattern Film (1)>

Example 1B

A resin film was formed by spin-coating the photosensitive resin composition in Example 1A (Expansion: 50 to 400 rpm for 40 seconds, Stabilization: 500 rpm for 30 seconds) onto a copper sputtered film of a silicon wafer substrate provided with the copper sputtered film by using a coater/developer (product name "ACT-8") manufactured by Tokyo Electron Limited, and then heating under the conditions shown in Table 2. The above resin film was exposed by using a stepper (model "NSR-i10D" manufactured by Nikon Corporation) via a pattern mask. The exposed coating was heated at 90° C. for 180 seconds and then immersed in a 2.38% by mass of tetramethylammonium hydroxide aqueous solution for 180 seconds to perform development. Thereafter, washing with flowing water and nitrogen blowing were performed, and the resist pattern film in Example 1B was formed on the copper sputtered film of the substrate (a resist pattern film having a square-shaped opening in an array shape shown in FIG. 1, as viewed from the top. a=20 μm, b=20 μm, thickness of resist pattern film=50 μm).

This resist pattern film was cut along plane Z parallel to the square-shaped opening and passing through the center point, and the shape of the cross section was observed with an electron microscope. As shown in FIG. 2, there were measured width w1 of the resist pattern film at a portion where the resist pattern film and the copper sputtered film were in contact with each other, width w2 of the resist pattern film 5 μm above the contact portion, width w3 of the resist pattern film 10 μm above the contact portion, and width w4 of the resist pattern film 15 μm above the contact portion. The evaluation results are shown in Table 2.

Example 2B to Example 5B and Comparative Example 1B to Comparative Example 6B

Resist pattern films in Example 2B to Example 5B and Comparative Example 1B to Comparative Example 6B were produced in the same manner as in Example 1B, except that the photosensitive resin composition shown in Table 2 was used in Example 1B, instead of the photosensitive resin composition in Example 1A, and widths w1 to w4 of the cross section of the resist pattern film were measured. The evaluation results are shown in Table 2.

<Production of Plated Formed Product (1)>

Example 1C

A plated formed product was produced by the electrolytic plating treatment with the resist pattern film in Example 1B as a mold. As a pretreatment for the electrolytic plating treatment, the treatment with oxygen plasma (output of 100 W, oxygen flow rate of 100 ml, treatment time of 60 seconds) was performed, and then washing with water was performed. The pretreated patterning substrate was immersed in 1 L of a copper plating solution (product name "MICROFAB SC-40", manufactured by MacDermid Performance Solutions Japan K.K.), and the electroplating treatment was performed at a plating bath temperature of 25° C. and a current density of 8 A/dm² for 1200 seconds to produce a plated formed product.

After the production of the plated formed product, using an electron microscope, observed was whether or not the plating solution had penetrated into the interface between the resist pattern film and the copper sputtered film of the silicon wafer substrate. The shape of the plated formed product was evaluated and the presence or absence of the penetration of the plating solution was evaluated as "resistance to a plating solution" according to the following evaluation criteria. The evaluation results are shown in Table 2 below.

AA: no penetration of plating solution.
BB: penetration of plating solution.

Example 2C to Example 5C and Comparative Example 1C to Comparative Example 6C

Plated formed products in Example 2C to Example 5C and Comparative Examples 1C to Comparative Example 6C were produced in the same manner as in Example 1C, except that the resist pattern film shown in Table 2 was used in Example 1C instead of the resist pattern film in Example 1B, and the resistance to a plating solution was evaluated. The evaluation results are shown in Table 2.

TABLE 2

| Photo-sensitive resin composition | Production of resist pattern film | Heating condition after spin-coating | W1 [μm] | W2 [μm] | W3 [μm] | W4 [μm] | Pattern shape | Shape of plated formed product | Evaluation of resistance to plating solution |
|---|---|---|---|---|---|---|---|---|---|
| Example 1A | Example 1B | 140° C. 300 sec | 20.1 | 19.5 | 19.6 | 19.8 | Rectangle | Rectangle | AA |
| Example 2A | Example 2B | 140° C. 300 sec | 20.0 | 19.5 | 19.6 | 19.9 | Rectangle | Rectangle | AA |
| Example 3A | Example 3B | 135° C. 300 sec | 20.3 | 19.7 | 19.7 | 19.9 | Rectangle | Rectangle | AA |
| Example 4A | Example 4B | 140° C. 300 sec | 20.2 | 19.6 | 19.6 | 19.8 | Rectangle | Rectangle | AA |
| Example 5A | Example 5B | 135° C. 300 sec | 20.2 | 19.6 | 19.7 | 19.9 | Rectangle | Rectangle | AA |
| Comparative Example 1A | Comparative Example 1B | 135° C. 300 sec | 20.6 | 19.7 | 19.7 | 19.8 | Partial defect | Rectangle | AA |
| Comparative Example 2A | Comparative Example 2B | 140° C. 300 sec | 19.8 | 18.2 | 18.7 | 19.8 | Dumbbell | Barrel | BB |
| Comparative Example 3A | Comparative Example 3B | 140° C. 300 sec | 20.0 | 18.8 | 19.2 | 19.7 | Dumbbell | Barrel | BB |
| Comparative Example 4A | Comparative Example 4B | 140° C. 300 sec | 19.9 | 18.6 | 19.2 | 19.7 | Dumbbell | Barrel | BB |
| Comparative Example 5A | Comparative Example 5B | 140° C. 300 sec | 20.4 | 19.8 | 19.7 | 19.8 | Partial defect | Rectangle | BB |
| Comparative Example 6A | Comparative Example 6B | 140° C. 300 sec | 19.8 | 18.5 | 19.2 | 19.8 | Dumbbell | Barrel | AA |

<Production of Photosensitive Resin Composition (2)>

Example 6A to Example 10A and Comparative Example 7A to Comparative Example 12A In Example 1A, Photosensitive resin compositions in Example 6A to Example 10A and Comparative Example 7A to Comparative Example 12A were produced in the same manner as in Example 1A, except that the polymer (A1) was changed to polymer (A2) (Mw=53000) having a structural unit derived from a monomer represented by the following formula (A2), and the mixed solvent was changed to a mixed solvent having components shown in Table 3 below.

[Chemical Formula 7]

(A2)

Each of the suffixes of the monomer-derived structural unit in formula (A2) represents a molar content ratio (mol %) of the monomer-derived structural unit included in the structural units derived from all monomers of polymer (A2).

TABLE 3

|  | C1 | C2 | C3-1 | C3-2 | C3-3 |
|---|---|---|---|---|---|
| Example 6A | 85 | 10 |  | 5 |  |
| Example 7A | 82 | 18 |  |  |  |
| Example 8A | 95 | 5 |  |  |  |
| Example 9A | 85 | 15 |  |  |  |
| Example 10A | 90 | 10 |  |  |  |
| Comparative Example 7A | 100 |  |  |  |  |
| Comparative Example 8A | 60 | 40 |  |  |  |
| Comparative Example 9A | 80 |  | 20 |  |  |
| Comparative Example 10A | 85 |  |  |  | 15 |
| Comparative Example 11A | 90 | 3 | 7 |  |  |
| Comparative Example 12A | 80 | 20 |  |  |  |

The numerical values in Table 3 are based on parts by mass.

<Production of resist pattern film (2)>

Example 6B to Example 10B and Comparative Example 7B to Comparative Example 12B Resist pattern films in Example 6B to Example 10B and Comparative Example 7B to Comparative Example 12B were produced in the same manner as in Example 1B, except that the photosensitive resin composition shown in Table 4 was used in Example 1B, instead of the photosensitive resin composition in Example 1A, and widths w1 to w4 of the cross section of the resist pattern film were measured. The evaluation results are shown in Table 4.

<Production of Plated Formed Product (2)>

Example 6C to Example 10C and Comparative Example 7C to Comparative Example 12C Plated formed products in Example 6C to Example 10C and Comparative Examples 7C to Comparative Example 12C were produced in the same manner as in Example 1C, except that the resist pattern film shown in Table 4 was used in Example 1C instead of the resist pattern film in Example 1B, and the resistance to a plating solution was evaluated. The evaluation results are shown in Table 4.

TABLE 4

| Photosensitive resin composition | Production of resist pattern film | Heating condition after spin-coating | W1 [μm] | W2 [μm] | W3 [μm] | W4 [μm] | Pattern shape | Shape of plated formed product | Evaluation of resistance to plating solution |
|---|---|---|---|---|---|---|---|---|---|
| Example 6A | Example 6B | 140° C. 300 sec | 20.2 | 19.3 | 19.5 | 19.8 | Rectangle | Rectangle | AA |
| Example 7A | Example 7B | 140° C. 300 sec | 20.2 | 19.2 | 19.5 | 19.9 | Rectangle | Rectangle | AA |
| Example 8A | Example 8B | 135° C. 300 sec | 20.3 | 19.3 | 19.7 | 19.9 | Rectangle | Rectangle | AA |
| Example 9A | Example 9B | 140° C. 300 sec | 20.1 | 19.4 | 19.6 | 19.9 | Rectangle | Rectangle | AA |
| Example 10A | Example 10B | 135° C. 300 sec | 20.2 | 19.4 | 19.6 | 19.8 | Rectangle | Rectangle | AA |
| Comparative Example 7A | Comparative Example 7B | 135° C. 300 sec | 20.6 | 19.4 | 19.6 | 19.8 | Partial defect | Rectangle | AA |
| Comparative Example 8A | Comparative Example 8B | 140° C. 300 sec | 19.5 | 18.0 | 18.5 | 19.8 | Dumbbell | Barrel | BB |
| Comparative Example 9A | Comparative Example 9B | 140° C. 300 sec | 19.7 | 18.5 | 18.9 | 19.7 | Dumbbell | Barrel | BB |
| Comparative Example 10A | Comparative Example 10B | 140° C. 300 sec | 19.5 | 18.6 | 19 | 19.7 | Dumbbell | Barrel | BB |
| Comparative Example 11A | Comparative Example 11B | 140° C. 300 sec | 20.1 | 19.6 | 19.8 | 19.9 | Partial defect | Rectangle | BB |
| Comparative Example 12A | Comparative Example 12B | 140° C. 300 sec | 19.8 | 18.3 | 18.8 | 19.8 | Dumbbell | Barrel | AA |

Example 11A to Example 15A and Comparative Example 13A to Comparative Example 17A A photosensitive resin composition was produced in the same manner as in Example 1A, except that the mixed solvent was changed to a mixed solvent having components shown in Table 5 below in Example 1A.
<Production of Tin-Silver Plated-Formed Product>

Resist pattern films in Example 11B to Example 15B and resist pattern films in Comparative Example 13B to Comparative Example 17B were produced in the same manner as in Example 1B by using the photosensitive resin compositions produced in Example 11A to Example 15A and Comparative Example 13A to Comparative Example 17A. Using the resist pattern film as a mold, the electrolytic plating treatment was performed to produce a plated formed product. As a pretreatment for the electrolytic plating treatment, the treatment with oxygen plasma (output of 100 W, oxygen flow rate of 100 ml, treatment time of 60 seconds) was performed, and then washing with water was performed. The pretreated patterning substrate was immersed in 1 L of a tin-silver plating solution (product name: "UTB TS –140", manufactured by Ishihara Chemical Co., Ltd.), and subjected to electroplating treatment for 360 seconds at a plating bath temperature of 25° C. and a current density of 3 A/dm² to produce a plated formed product. The substrate was immersed in a stripping solution (weight ratio=50:50) containing dimethyl sulfoxide and N, N-dimethylformamide at room temperature for 5 minutes to remove the resist pattern film of the mold.
<Residue on Plated Formed Product>

The plated formed product after removal of the resist pattern film was observed with an electron microscope, and the state of the side surface was evaluated according to the following evaluation criteria. The evaluation results are shown in Table 6 below.
  AA: No residue was observed.
  B: Residue was scattered on the entire side surface of the plated formed product.
  BB: Residue was attached only in the vicinity of the interface with the substrate of the plated formed product.

<Swelling of Resist Film During Immersion in Plating Solution>

Resist pattern films in Example 11B to Example 15B and resist pattern films in Comparative Example 13B to Comparative Example 17B were produced in the same manner as in Example 1B by using the photosensitive resin compositions produced in Example 11A to Example 15A and Comparative Example 13A to Comparative Example 17A. This resist pattern film was immersed in 1 L of a tin-silver plating solution (product name: "UTB TS-140", manufactured by Ishihara Chemical Co., Ltd.) for 20 minutes at 25° C. The resist pattern film after immersion was observed with an electron microscope. The observation of swelling of the resist pattern film was judged as "swelling", and no observation of swelling was judged as "no swelling". The evaluation results are shown in Table 6.

TABLE 5

| | C1 | C2 | C3-1 | C3-2 | C3-3 |
|---|---|---|---|---|---|
| Example 11A | 85 | 10 | | 5 | |
| Example 12A | 80 | 20 | | | |
| Example 13A | 70 | 30 | | | |
| Example 14A | 76 | 20 | 4 | | |
| Example 15A | 90 | 5 | | | 5 |
| Comparative Example 13A | 100 | | | | |
| Comparative Example 14A | | 100 | | | |
| Comparative Example 15A | 65 | 35 | | | |
| Comparative Example 16A | 97 | 3 | | | |
| Comparative Example 17A | 65 | 5 | | 30 | |

The numerical values in Table 5 are based on parts by mass.

TABLE 6

| Photosensitive resin composition | Production of resist pattern film | Heating condition after spin-coating | Residue on plated formed product | Swelling of resist film during immersion in plating solution |
|---|---|---|---|---|
| Example 11A | Example 11B | 135° C. 300 sec | AA | No swelling |

TABLE 6-continued

| Photosensitive resin composition | Production of resist pattern film | Heating condition after spin-coating | Residue on plated formed product | Swelling of resist film during immersion in plating solution |
|---|---|---|---|---|
| Example 12A | Example 12B | 140° C. 300 sec | AA | No swelling |
| Example 13A | Example 13B | 140° C. 300 sec | AA | No swelling |
| Example 14A | Example 14B | 140° C. 300 sec | AA | No swelling |
| Example 15A | Example 15B | 135° C. 300 sec | AA | No swelling |
| Comparative Example 13A | Comparative Example 13B | 135° C. 300 sec | BB | No swelling |
| Comparative Example 14A | Comparative Example 14B | 140° C. 300 sec | AA | Swelling |
| Comparative Example 15A | Comparative Example 15B | 140° C. 300 sec | AA | Swelling |
| Comparative Example 16A | Comparative Example 16B | 140° C. 300 sec | B | No swelling |
| Comparative Example 17A | Comparative Example 17B | 140° C. 300 sec | AA | Swelling |

REFERENCE SIGNS LIST

10 Opening of resist pattern film
20 Resist pattern film
30 Substrate
31 Metal film

The invention claimed is:

1. A photosensitive resin composition comprising:
a polymer (A) having an acid dissociative group;
a photoacid generator (B); and
a solvent (C) comprising: 80 to 95% by mass of propylene glycol monomethyl ether acetate (C1); 5 to 18% by mass of 3-methoxybutyl acetate (C2); and optionally 0 to 10% by mass of other solvent (C3), a content ratio of the solvent (C) contained in the photosensitive resin composition being less than 60% by mass.

2. The photosensitive resin composition according to claim 1, wherein the solvent (C) comprises: 85 to 90% by mass of the propylene glycol monomethyl ether acetate (C1); 10 to 15% by mass of the 3-methoxybutyl acetate (C2); and optionally 0 to 5% by mass of the other solvent (C3).

3. The photosensitive resin composition according to claim 1, comprising: 30 to 60% by mass of the polymer (A) having an acid dissociative group; 0.1 to 6% by mass of the photoacid generator (B); and 40% by mass or more and less than 60% by mass of the solvent (C).

4. A method for producing a resist pattern film, the method comprising:
forming a resin film on a metal film of a substrate by applying the photosensitive resin composition according to claim 1, the metal film being formed on a surface of the substrate;
exposing the resin film; and
developing the exposed resin film.

5. The method for producing a resist pattern film according to claim 4, wherein the resist pattern film produced has a thickness of 30 to 100 μm.

6. A method for producing a plated formed product, the method comprising performing a plating treatment with the resist pattern film, as a mold, formed by the method for producing a resist pattern film according to claim 4.

7. A method for producing a tin-silver plated-formed product, comprising:
forming a resin film on a metal film of a substrate by applying a photosensitive resin composition, the metal film being formed on a surface of the substrate;
exposing the resin film;
developing the exposed resin film to provide a resist pattern film; and
tin-silver plating with the resist pattern film as a mold to form a plated formed product, the photosensitive resin composition comprising: a polymer (A) having an acid dissociative group; a photoacid generator (B); and a solvent (C), and the solvent (C) comprising: 70 to 95% by mass of propylene glycol monomethyl ether acetate (C1); and 5 to 30% by mass of 3-methoxybutyl acetate (C2).

8. The method for producing a tin-silver plated-formed product according to claim 7, wherein a content ratio of the solvent (C) contained in the photosensitive resin composition is less than 60% by mass.

9. The method for producing a tin-silver plated-formed product according to claim 7, wherein the solvent (C) comprises: 80 to 95% by mass of the propylene glycol monomethyl ether acetate (C1); 5 to 18% by mass of the 3-methoxybutyl acetate (C2); and optionally 0 to 10% by mass of other solvent (C3).

* * * * *